US012560631B2

(12) United States Patent
Liang et al.

(10) Patent No.: US 12,560,631 B2
(45) Date of Patent: Feb. 24, 2026

(54) MONITORING SIGNAL GENERATION CIRCUIT OF SMART POWER STAGE AND METHOD THEREOF

(71) Applicant: uPI semiconductor corp., Zhubei City (TW)

(72) Inventors: Yow-Tsyr Liang, Zhubei City (TW); Chi-Ping Lin, Zhubei City (TW)

(73) Assignee: UPI SEMICONDUCTOR CORP., Zhubei City (TW)

( * ) Notice: Subject to any disclaimer, the term of this patent is extended or adjusted under 35 U.S.C. 154(b) by 179 days.

(21) Appl. No.: 18/680,039

(22) Filed: May 31, 2024

(65) Prior Publication Data

US 2025/0035678 A1     Jan. 30, 2025

(30) Foreign Application Priority Data

Jul. 26, 2023     (CN) .......................... 202310924148.3

(51) Int. Cl.
| | |
|---|---|
| *G01R 5/14* | (2006.01) |
| *G01R 17/02* | (2006.01) |
| *G01R 19/165* | (2006.01) |

(52) U.S. Cl.
CPC ....... *G01R 17/02* (2013.01); *G01R 19/16538* (2013.01)

(58) Field of Classification Search
CPC .......................... G01R 19/16538; G01R 17/02
See application file for complete search history.

(56) References Cited

U.S. PATENT DOCUMENTS

| | | | | |
|---|---|---|---|---|
| 9,184,651 | B2 | 11/2015 | Nguyen et al. | |
| 10,116,212 | B2 | 10/2018 | Luo et al. | |
| 11,316,502 | B1 * | 4/2022 | Cheung | H03K 3/0372 |
| 12,009,749 | B2 * | 6/2024 | Xue | H02M 1/088 |
| 2014/0258755 | A1 * | 9/2014 | Stenfort | G06F 1/30 |
| | | | | 713/323 |
| 2025/0350272 | A1 * | 11/2025 | Bianchi | H03K 3/356017 |

* cited by examiner

*Primary Examiner* — Thang X Le
(74) *Attorney, Agent, or Firm* — McClure, Qualey & Rodack, LLP

(57) ABSTRACT

A monitoring signal generation circuit of a SPS and method thereof is disclosed. The SPS provides an output current. The monitoring signal generation circuit provides a current monitoring signal related to the output current. The monitoring signal generation circuit includes a simulation current circuit and a control circuit. The simulation current circuit receives a reference voltage and provides a simulation current signal or the reference voltage as the current monitoring signal. The control circuit is coupled to the simulation current circuit and configured to receive the reference signal, the current monitoring signal and an indication signal. During a period when the indication signal indicates that power switches of the SPS are turned off, the control circuit controls the simulation current generation circuit to provide the simulation current signal or the reference voltage as the current monitoring signal according to the current monitoring signal and the reference voltage.

12 Claims, 7 Drawing Sheets

MONITORING SIGNAL GENERATION CIRCUIT OF SMART POWER STAGE AND METHOD THEREOF

BACKGROUND OF THE INVENTION

1. Field of the Invention

The invention relates to a smart power stage (SPS); in particular, to a monitoring signal generation circuit of the SPS and a method thereof.

2. Description of the Prior Art

In general, when a conventional SPS receives a pulse width modulation (PWM) signal provided by an external controller, a driver in the SPS will convert the PWM signal into an on-time signal for a driving circuit to control an upper-bridge switch and a lower-bridge switch of an output stage to be turned on and off alternately, so a function of adjusting an output voltage and an output current can be achieved. Under light-load or special conditions (such as during a protection mechanism), since there is no need to switch temporarily, the controller will switch the PWM signal to a tri-state to turn off the upper-bridge switch and the lower-bridge switch at the same time, so the switching frequency can be significantly reduced to reduce the switching losses.

For the SPS that can provide a simulation current signal as a monitoring signal (IMON) to the controller, because the simulation current signal is generated according to the PWM signal, when the PWM signal is in the tri-state, the monitoring signal will be reset to a reference voltage (REFIN) with a fixed value.

However, since the SPS cannot determine light-load or heavy-load, if it enters this state during an over-current protection (OCP) period of heavy-load, the monitoring signal will be reset to the reference voltage, causing the SPS to be unable to obtain correct output current information during this period. When the SPS resumes switching, the OCP mechanism cannot be triggered, which will cause the switch to burn out. This problem needs to be further solved.

SUMMARY OF THE INVENTION

Therefore, the invention provides a monitoring signal generation circuit of a smart power stage and a method thereof to solve the above-mentioned problems of the prior arts.

A preferred embodiment of the invention is a monitoring signal generation circuit of a smart power stage. In this embodiment, the smart power stage provides an output current. The monitoring signal generation circuit provides a current monitoring signal related to the output current. The monitoring signal generation circuit includes a simulation current circuit and a control circuit. The simulation current circuit receives a reference voltage and provides a simulation current signal or the reference voltage as the current monitoring signal. The control circuit is coupled to the simulation current circuit and configured to receive the reference signal, the current monitoring signal and an indication signal. During a period when the indication signal indicates that power switches of the smart power stage are turned off, the control circuit controls the simulation current generation circuit to provide the simulation current signal or the reference voltage as the current monitoring signal according to the current monitoring signal and the reference voltage.

In an embodiment, the simulation current circuit includes a ramp signal generation circuit and a switch. The ramp signal generation circuit is coupled to an output node of the simulation current circuit and configured to provide a ramp signal as the simulation current signal during a period when the smart power stage provides the output current. One terminal of the switch is coupled to the output node and another terminal of the switch receiving the reference voltage. During the period when the indication signal indicates that the power switches of the smart power stage are turned off, when the current monitoring signal is not equal to the reference voltage, the switch is turned off to cause the ramp signal generation circuit to continuously provide the ramp signal. When the current monitoring signal is equal to the reference voltage, the switch is turned on, so that the simulation current circuit provides the reference voltage as the current monitoring signal.

In an embodiment, when the current monitoring signal is greater than the reference voltage, the ramp signal has a negative slope; when the current monitoring signal is less than the reference voltage, the ramp signal has a positive slope.

In an embodiment, the monitoring signal generation circuit further includes a sensing signal generation circuit and a selector. The sensing signal generation circuit is configured to generate a current sensing signal according to the output current or a switch voltage of the smart power stage. The selector is coupled to the sensing signal generation circuit, the output node of the simulation current circuit and an output terminal of the monitoring signal generation circuit respectively and configured to selectively connect the output terminal of the monitoring signal generation circuit to the sensing signal generation circuit or the output node of the simulation current circuit according to a pulse width modulation signal.

In an embodiment, the smart power stage includes a driver, the monitoring signal generation circuit and an output stage. The driver is coupled to an external controller and the output stage respectively and configured to receive a pulse width modulation signal from the controller to control the output stage. The output stage includes the power switches to provide the output current. The monitoring signal generation circuit is coupled to the drive circuit, the output stage and the controller respectively, and provides the current monitoring signal to the controller according to the pulse width modulation signal. The pulse width modulation signal has a first state, a second state and a tri-state between the first state and the second state, and the indication signal is synchronized with the tri-state of the pulse width modulation signal.

In an embodiment, the control circuit includes a comparison circuit and a logic circuit. The comparison circuit is configured to compare the current monitoring signal with the reference voltage to generate a comparison result. The logic circuit is coupled to the comparison circuit and the simulation current circuit respectively and configured to generate a switching signal according to the indication signal and the comparison result to control the simulation current circuit to provide the reference voltage as the current monitoring signal.

In an embodiment, during the period when the indication signal indicates that the power switches of the smart power stage are turned off, when the comparison result changes state, the switching signal controls the simulation current circuit to output the reference voltage as the current monitoring signal.

Another preferred embodiment of the invention is monitoring signal generation method of a smart power stage. In this embodiment, the monitoring signal generation method is used for generating a current monitoring signal related to an output current provided by the smart power stage. The monitoring signal generation method includes steps of: (a) determining whether an indication signal indicates that power switches of the smart power stage are turned off; and (b) if a determination result of the step (a) is yes, selectively providing a simulation current signal or a reference voltage as the current monitoring signal according to the current monitoring signal and the reference voltage.

In an embodiment, if the current monitoring signal is not equal to the reference voltage, the step (b) continues to provide a ramp signal as the current monitoring signal.

In an embodiment, the step (b) includes: if the current monitoring signal is greater than the reference voltage, the ramp signal has a negative slope; if the current monitoring signal is less than the reference voltage, the ramp signal having a positive slope.

In an embodiment, the step (b) includes: (b1) comparing the current monitoring signal with the reference voltage to generate a comparison result; and (b2) providing the reference voltage as the current monitoring signal according to the indication signal and the comparison result.

In an embodiment, when the comparison result changes state, the step (b2) provides the reference voltage as the current monitoring signal.

Compared to the prior art, even when the pulse width modulation signal received by the smart power stage is a tri-state signal, the monitoring signal generation circuit and method of the smart power stage in the invention can still provide a current monitoring signal that reflects the output current waveform (IMON) instead of directly switching the current monitoring signal into the reference voltage, so that the over-current protection (OCP) mechanism can still operate normally.

The advantage and spirit of the invention may be understood by the following detailed descriptions together with the appended drawings.

BRIEF DESCRIPTION OF THE APPENDED DRAWINGS

DETAILED DESCRIPTION OF THE INVENTION

Figure 1:
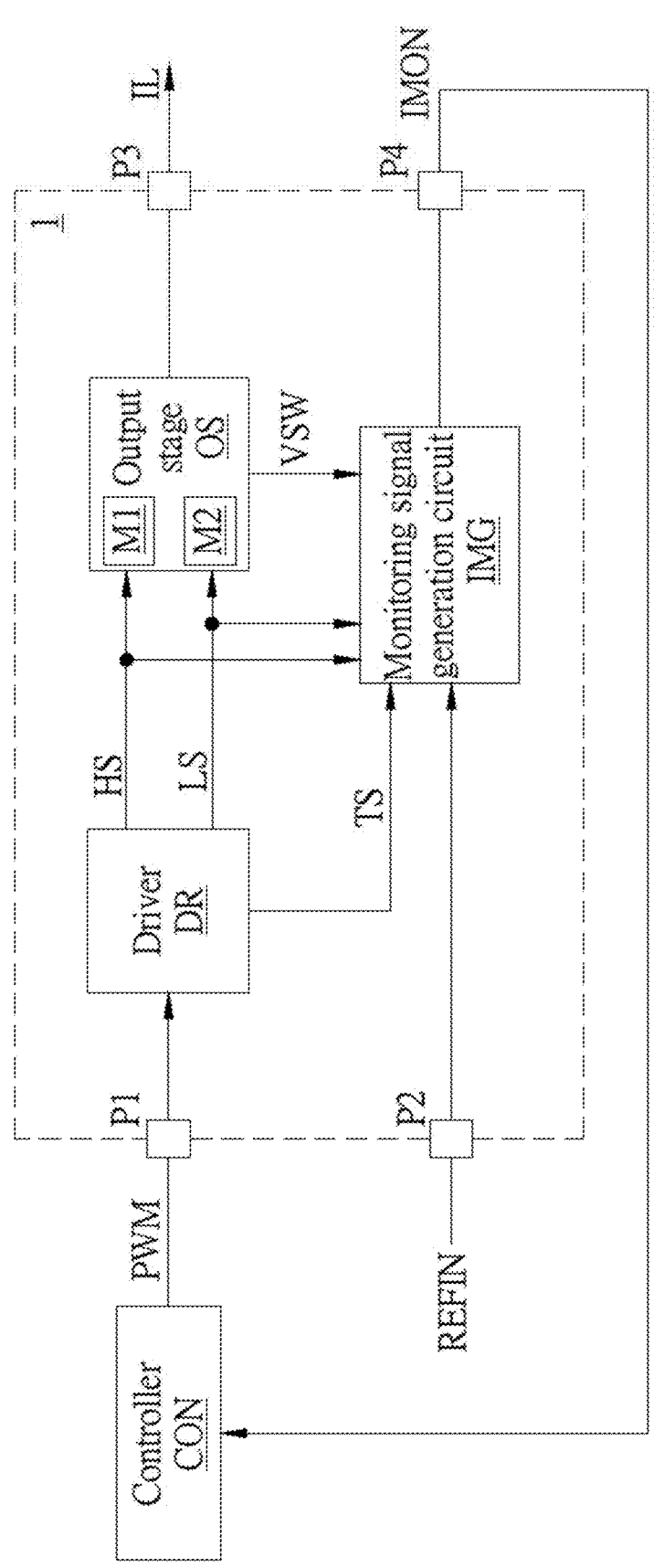
FIG. 1 is a schematic diagram of a smart power stage (SPS) IC in an embodiment of the invention.

Reference will now be made in detail to the exemplary embodiments of the invention, examples of which are illustrated in the accompanying drawings. Elements/components with the same or similar numbers used in the drawings and embodiments are intended to represent the same or similar parts.

An embodiment of the invention is a monitoring signal generation circuit of a smart power stage (SPS). In this embodiment, the SPS receives a pulse width modulation (PWM) signal and provides an output current (IL). The monitoring signal generation circuit provides a current monitoring signal (IMON) related to the output current. When the PWM signal is a tri-state signal, the current monitoring signal outputted by the monitoring signal generation circuit can still reflect the output current normally, so that the over-current protection (OCP) mechanism of the SPS can still function normally.

Please refer to FIG. 1, which is a schematic diagram of the SPS in this embodiment. As shown in FIG. 1, the SPS 1 is coupled to an external controller CON. The SPS 1 includes a driver DR, a monitoring signal generation circuit IMG and an output stage OS. The driver DR is coupled to the monitoring signal generation circuit IMG and the output stage OS respectively, and the driver DR is coupled to the controller CON through a pin P1. The output stage OS is coupled to the monitoring signal generation circuit IMG.

The controller CON provides the pulse width modulation signal PWM to the driver DR. The driver DR receives the pulse width modulation signal PWM and generates a first control signal HS and a second control signal LS respectively to the output stage OS to control an upper-bridge switch M1 and a lower-bridge switch M2 (that is, power switches in the SPS, which is not shown in FIG. 1). The driver DR also generates an indication signal TS according to the pulse width modulation signal PWM to the monitoring signal generation circuit IMG.

The output stage OS receives the first control signal HS and the second control signal LS respectively and controls the power switches in the output stage OS (not shown in FIG. 1) to generate an output current (inductor current) IL to a pin P3. The output stage OS also generates a switching voltage VSW to the monitoring signal generation circuit IMG. The monitoring signal generation circuit IMG gets the first control signal HS, the second control signal LS, the indication signal TS from the driver DR and the switching voltage VSW, and receives the reference voltage REFIN from the SPS 1 through a pin P2, and the monitoring signal generation circuit IMG is used to generate a current monitoring signal IMON to a pin P4 and output the current monitoring signal IMON to the controller CON.

It should be noted that the pulse width modulation signal PWM provided by the controller CON has three states: a first state of high-level (H), a second state of low-level (L) and a tri-state between the high-level (H) and the low-level (L), but the first control signal HS, the second control signal LS and the indication signal TS provided by the driver DR only have two states: the first state of high-level (H) and the second state of low-level (L), but not limited to this.

For example, under the normal operating condition, when the pulse width modulation signal PWM is in the first state of high-level (H), the first control signal HS is in the first state of high-level (H) and the second control signal LS and the indication signal TS are in the second state of low-level (L); when the pulse width modulation signal PWM is in the second state of low-level (L), the first control signal HS and the indication signal TS are in the second state of low-level (L) and the second control signal LS is in the first state of high-level (H). When the pulse width modulation signal PWM is in the tri-state, the first control signal HS and the second control signal LS are both in the second state of low-level (L), and the indication signal TS is in the first state of high-level (H). In other words, the indication signal TS is synchronized with the tri-state of the pulse width modulation signal PWM, and when the indication signal TS is in the first state of high-level (H), the indication signal TS indicates that the upper-bridge switch M1 and the lower-bridge switch M2 of the output stage OS are both turned off.

Figure 2:
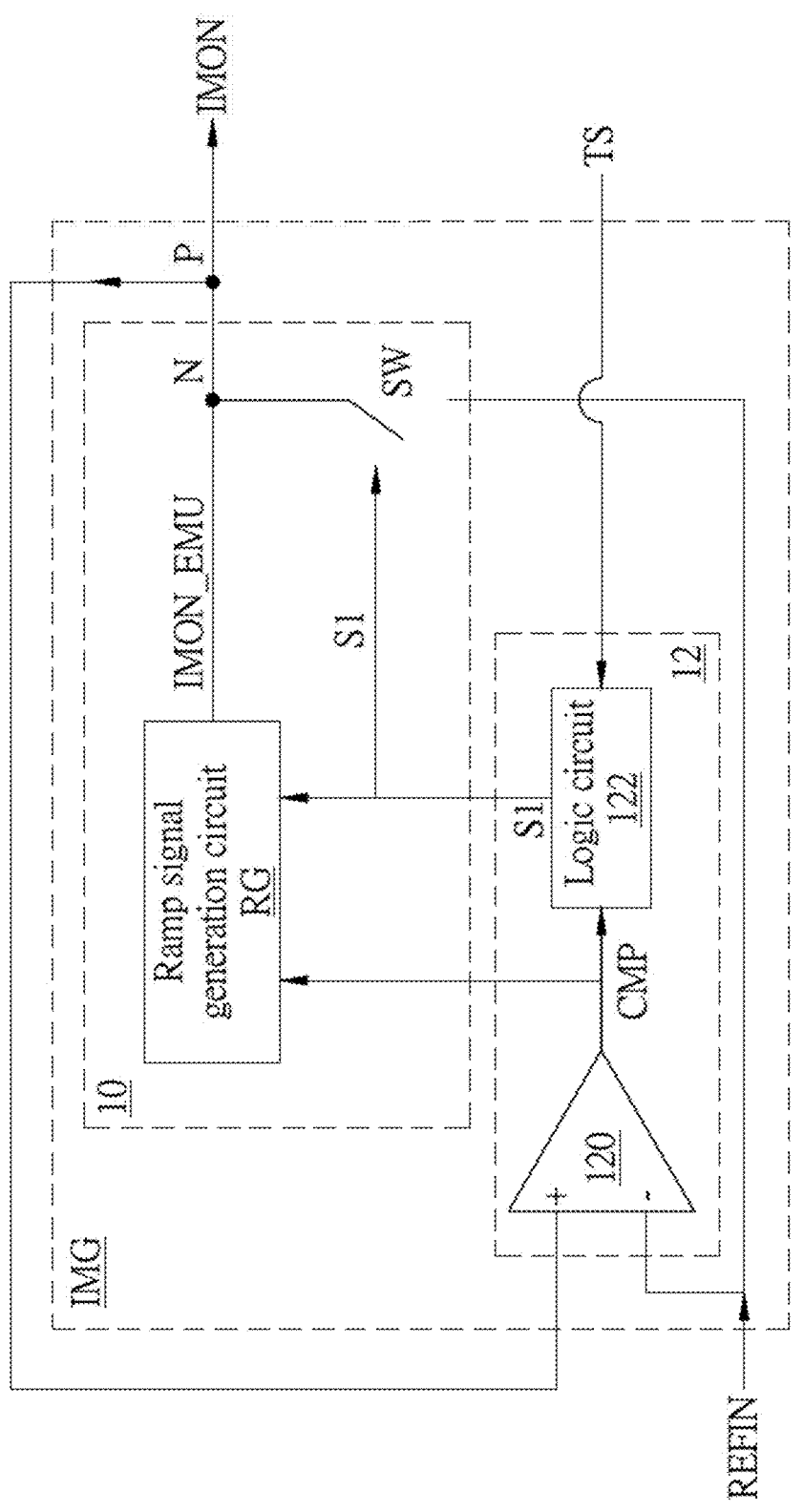
FIG. 2 is a schematic diagram of a monitoring signal generation circuit of a smart power stage in an embodiment of the invention.

Please refer to FIG. 2, which is a schematic diagram of the monitoring signal generation circuit IMG of the SPS 1 in this embodiment. As shown in FIG. 2, the monitoring signal generation circuit IMG includes a simulation current circuit 10, a control circuit 12 and an output terminal P. The control circuit 12 is coupled to the simulation current circuit 10. An output node N of the simulation current circuit 10 is coupled to the output terminal P of the monitoring signal generation circuit IMG.

The simulation current circuit 10 receives a reference voltage REFIN and provides a simulation current signal IMON_EMU or the reference voltage REFIN as a current monitoring signal IMON. The control circuit 12 receives the reference voltage REFIN, the current monitoring signal IMON and an indication signal TS respectively. During a period when the indication signal TS indicates that power switches of the SPS 1 (that is, an upper-bridge switch M1 and a lower-bridge switch M2 of an output stage OS which is not shown in FIG. 1) are turned off, the control circuit 12 controls the simulation current circuit 10 to provide the simulation current signal IMON_EMU or the reference voltage REFIN as the current monitoring signal IMON according to the current monitoring signal IMON and the reference voltage REFIN.

In this embodiment, the simulation current circuit 10 includes a ramp signal generation circuit RG and a switch SW. The ramp signal generation circuit RG is coupled to the output node N of the simulation current circuit 10 and provides a ramp signal as the simulation current signal IMON_EMU. One terminal of the switch SW is coupled to the output node N and the other terminal receives the reference voltage REFIN. When the value of the current monitoring signal IMON is not equal to the reference voltage REFIN, the switch SW is turned off, so that the ramp signal generation circuit RG continues to provide the ramp signal. When the current monitoring signal IMON is equal to the reference voltage REFIN, the switch SW is turned on, so that the simulation current circuit 10 provides the reference voltage REFIN as the current monitoring signal IMON.

In this embodiment, the control circuit 12 includes a comparator 120 and a logic circuit 122. A first input terminal "+" of the comparator 120 is coupled to the output node N to receive the current monitoring signal IMON. A second input terminal "−" of the comparator 120 receives the reference voltage REFIN. The comparator 120 compares the current monitoring signal IMON and the reference voltage REFIN to generate a comparison result CMP to the logic circuit 122. The logic circuit 122 receives the instruction signal TS and the comparison result CMP respectively, and generates a switching signal S1 according to the instruction signal TS and the comparison result CMP to control the switch SW in the simulation current circuit 10 to be turned on or off.

The simulation current circuit 10 receives the comparison result CMP from the comparator 120 and the switching signal S1 from the logic circuit 122, and determines a ramp waveform of the simulation current signal IMON_EMU and whether to continue to provide the simulation current signal IMON_EMU with the ramp waveform as the current monitoring signal IMON or to change to provide the reference voltage REFIN as the current monitoring signal IMON according to the comparison result CMP and the switching signal S1.

For example, if the comparison result CMP indicates that the value of current monitoring signal IMON is not equal to the reference voltage REFIN, the control circuit 12 will control the simulation current circuit 10 to continue to provide the simulation current signal IMON_EMU (that is, continue to provide the ramp signal) as the current monitoring signal IMON outputted by the monitoring signal generation circuit IMG; if the comparison result CMP indicates that the value of the simulation current signal IMON_EMU is equal to the reference voltage REFIN, the control circuit 12 will control the simulation current circuit 10 to provide the reference voltage REFIN as the current monitoring signal IMON outputted by the monitoring signal generation circuit IMG.

Figure 3:
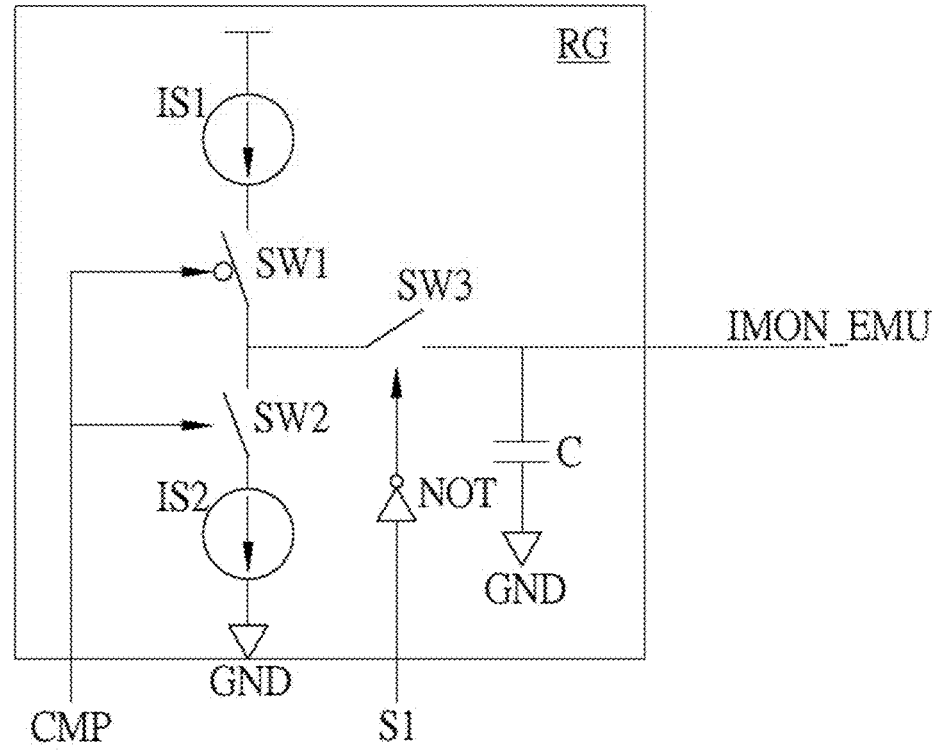
FIG. 3 is a schematic diagram of a simulation current circuit in an embodiment of the invention.

Please refer to FIG. 3. FIG. 3 is a schematic diagram of the ramp signal generation circuit RG in the simulation current circuit 10 in an embodiment of the invention. As shown in FIG. 3, the ramp signal generation circuit RG includes a first current source IS1, a second current source IS2, a first switch SW1, a second switch SW2, a third switch SW3, a not gate NOT and a capacitor C. The first switch SW1, the second switch SW2 and the second current source IS2 are coupled in series between the first current source IS1 and a ground terminal GND. One terminal of the third switch SW3 is coupled between the first switch SW1 and the second switch SW2 and the other terminal of the third switch SW3 is coupled to one terminal of the capacitor C. The other terminal of the capacitor C is coupled to the ground terminal GND.

The first switch SW1 and the second switch SW2 are turned on or off according to the comparison result CMP. When the first switch SW1 is turned on according to the comparison result CMP, the second switch SW2 is turned off according to the comparison result CMP; when the first switch SW1 is turned off according to the comparison result CMP, the second switch SW2 is turned on according to the comparison result CMP. The third switch SW3 is turned on or off according to the switching signal S1 after passing through the not gate NOT.

By doing so, the ramp signal generator RG can control the third switch SW3 to generate a ramp signal according to the switching signal S1 from the logic circuit 122, and control the first current source IS1 to charge the capacitor C or the second current source IS2 to discharge the capacitor C according to the comparison result CMP from the comparator 120 to determine whether the simulation current signal IMON_EMU has the ramp signal waveform with positive slope or the ramp signal waveform with negative slope.

Figure 4:
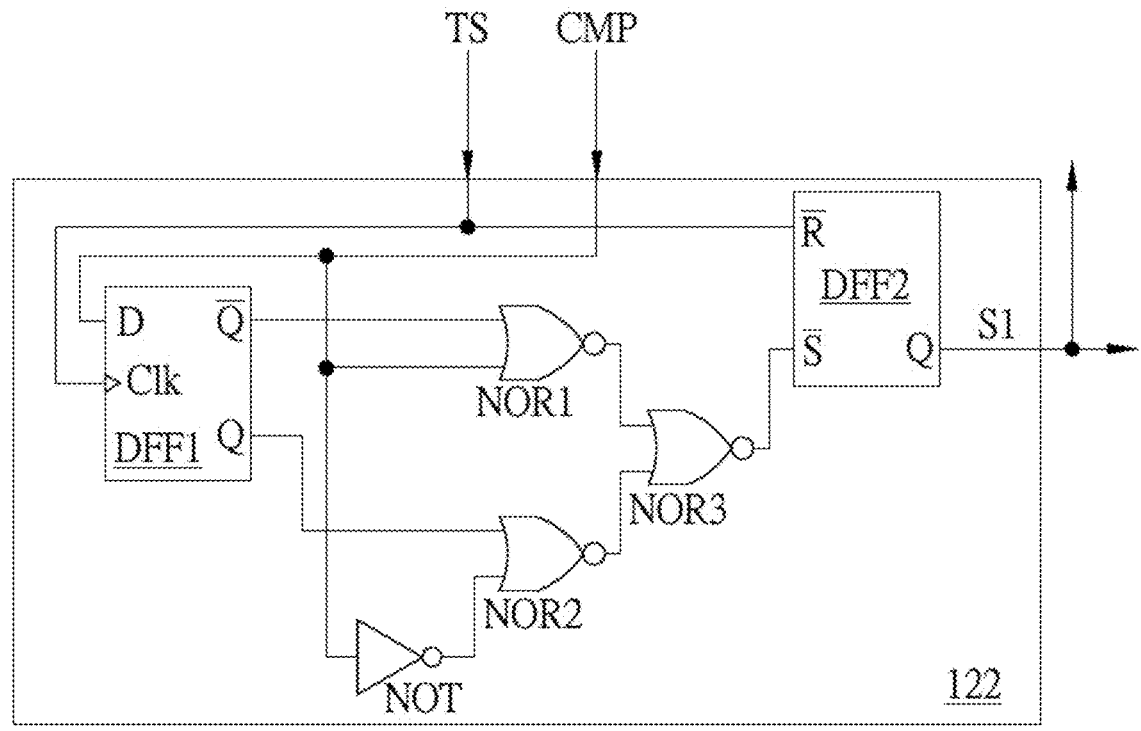
FIG. 4 is a schematic diagram of a logic circuit in an embodiment of the invention.

Please refer to FIG. 4. FIG. 4 is a schematic diagram of a logic circuit 122 in an embodiment of the invention. It should be noted that when the pulse width modulation signal PWM enters a tri-state, the indication signal TS is at high-level. During this period, the logic circuit 122 will continue to confirm whether the comparison result CMP of the current monitoring signal IMON and the reference voltage REFIN changes state. Once the comparison result CMP changes state, the logic circuit 122 will output the switching signal S1 to stop the capacitor C inside the simulation current circuit 10 from being charged/discharged, and control the switch SW to conduct the output node N to the reference voltage REFIN.

In an embodiment, the comparison result CMP of the switching signal S1 corresponding to different level changes and the truth table of the indication signal TS are shown in Table 1 below.

TABLE 1

| | The indication signal TS is at low-level (L) | The indication signal TS is at high-level (H) |
|---|---|---|
| The comparison result CMP changes from low-level (L) to high-level (H) | The switching signal S1 = 0 | The switching signal S1 = 1 |
| The comparison result CMP changes from high-level (H) to low-level (L) | The switching signal S1 = 0 | The switching signal S1 = 1 |
| The comparison result CMP is at low-level (L) | The switching signal S1 = 0 | The switching signal S1 = 0 |
| The comparison result CMP is at high-level (H) | The switching signal S1 = 0 | The switching signal S1 = 0 |

Figure 5A:
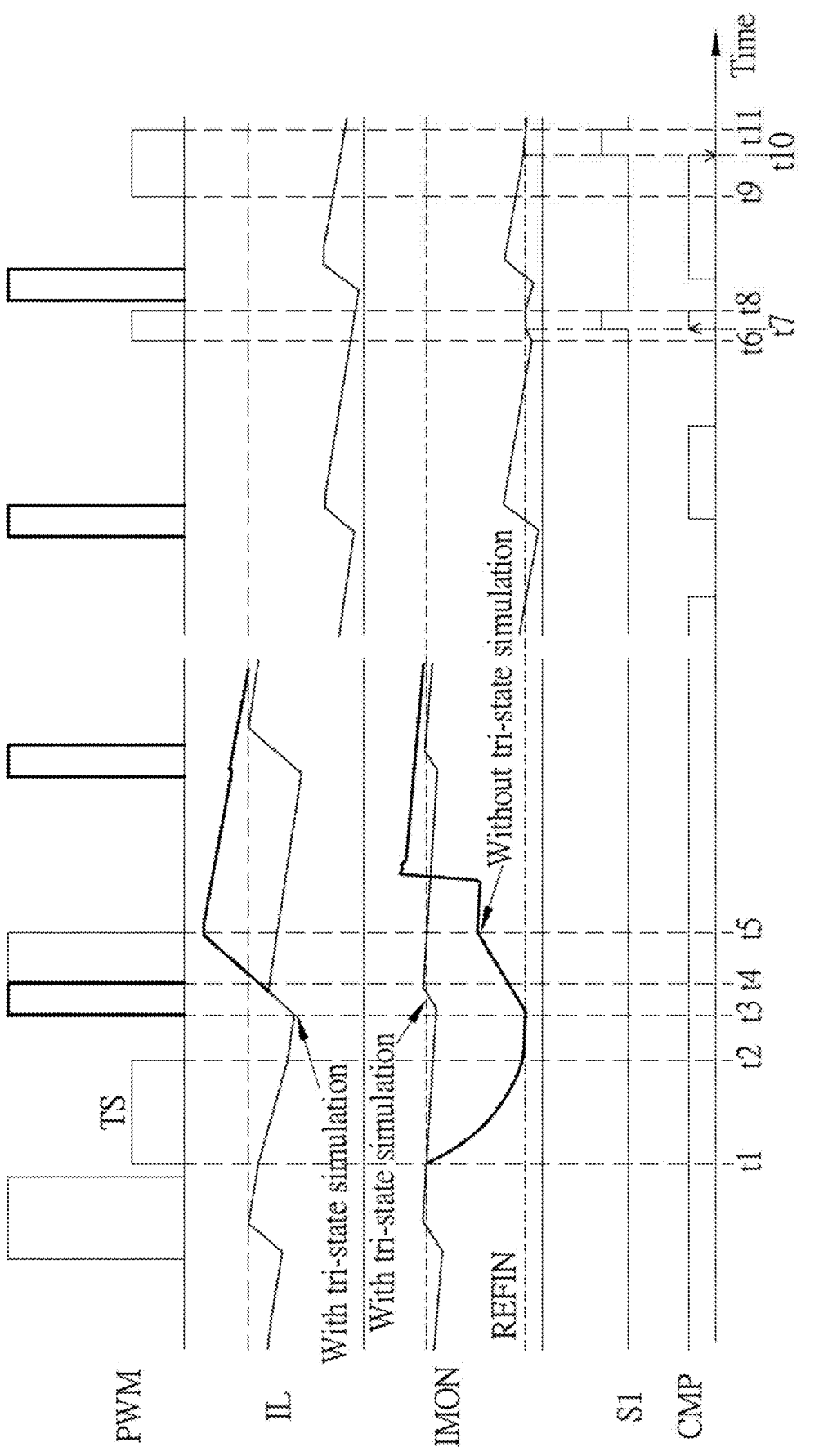
FIG. 5A is a waveform timing diagram of the pulse width modulation signal PWM, the output current IL, the current monitoring signal IMON, the switching signal S1 and the comparison result CMP respectively.
Figure 5B:
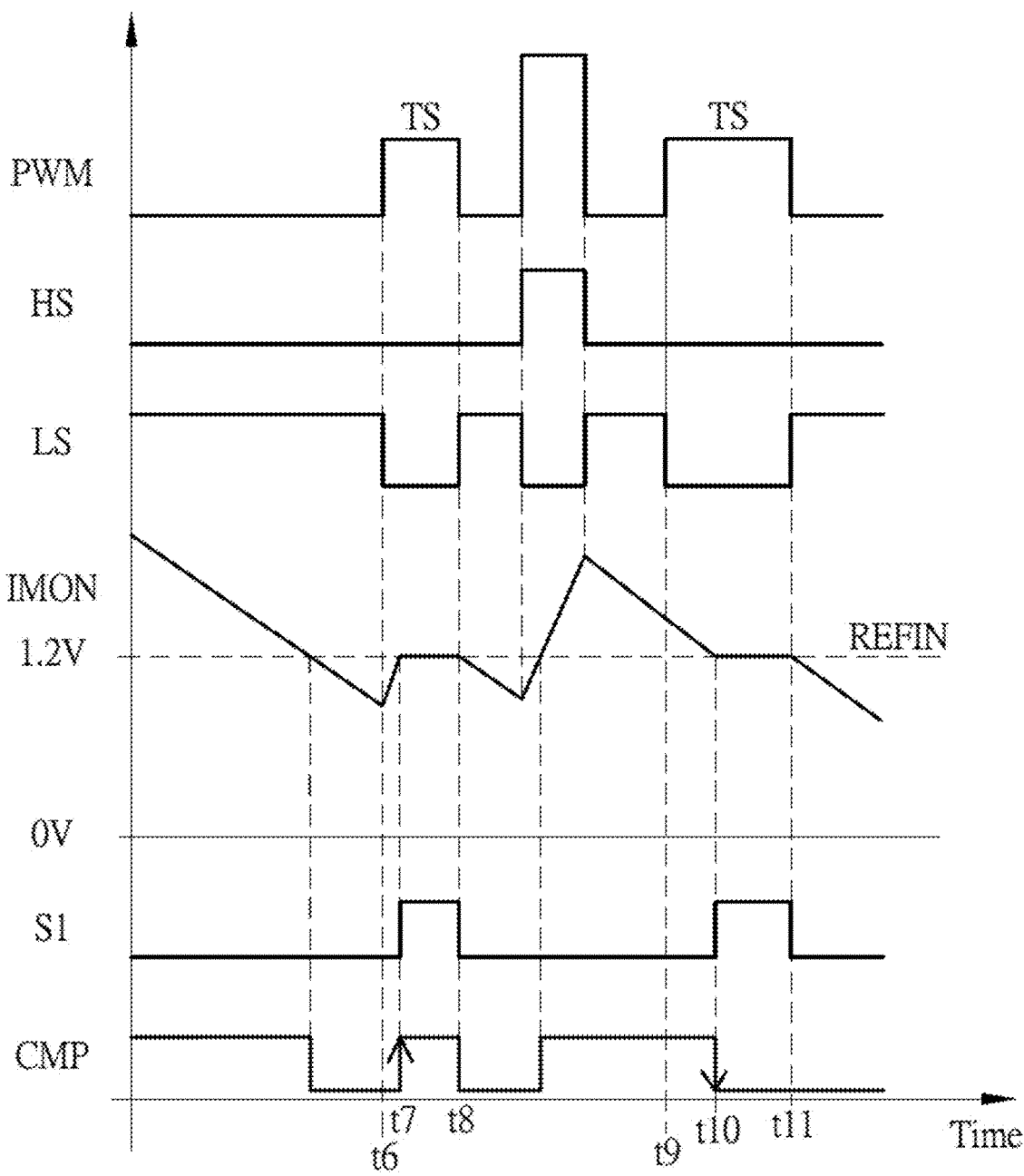
FIG. 5B is a waveform timing diagram when the current monitoring signal IMON approaches the reference voltage REFIN.

Please refer to FIG. 5A and FIG. 5B. FIG. 5A is a waveform timing diagram of the pulse width modulation signal PWM, the output current IL, the current monitoring signal IMON, the switching signal S1 and the comparison result CMP. FIG. 5B is a waveform timing diagram when the current monitoring signal IMON approaches to the reference voltage REFIN.

As shown in FIG. 5A, at the time t1, the indication signal TS changes to high-level (H), indicating that the pulse width modulation signal PWM enters the tri-state. At this time, the current monitoring signal IMON is greater than the reference voltage REFIN, and the comparison result CMP of the comparator 120 is at high-level (H). The logic circuit 122 sends the switching signal S1=0 according to that the indication signal TS is at high-level (H) and the comparison result CMP is at high-level (H) to keep the switching switch SW turned off and the switch SW3 turned on, while the simulation current circuit 10 generates the simulation current signal IMON_EMU in response to that the comparison result CMP is at high-level (H).

During a period from the time t1 to the time t2, since the comparison result CMP does not change state, the switching signal S1 sent by the logic circuit 122 is still maintained at 0, so that the current monitoring signal IMON continues to be a declining ramp signal. It should be noted that during the period from the time t1 to the time t2, the slope of the ramp signal is the same as the slope of the current monitoring signal IMON before the time t1. In contrast, the prior art simulation directly pulls the value of current monitoring signal IMON to the value of the reference voltage REFIN (for example, 1.2) in response to that the indication signal TS is at high-level (H) at the time t1.

At the time t2, the indication signal TS is at low-level (L), and the logic circuit 122 responds to that the indication signal TS at low-level (L) and sends the switching signal S1=0 to keep the switching switch SW turned off and the switch SW3 turned on. At the same time, the simulation current circuit 10 will generate a falling ramp signal as the current monitoring signal IMON according to that the pulse width modulation signal PWM is at low-level (L) based on the normal operation mechanism. In contrast to the prior art without three-state simulation, it also responds to that the indication signal TS is at low-level (L) to generate a falling ramp signal as the current monitoring signal IMON according to the pulse width modulation signal PWM is at low-level (L) based on the normal operation mechanism.

At the time t3, the pulse width modulation signal PWM is at high-level (H), and the simulation current signal IMON_EMU generated by the simulation current circuit 10 according to the normal operation mode start to raise.

At the time t4, the value of current monitoring signal IMON of the invention reaches the threshold of over-current protection (OCP) (for example, 1.9), the current-limit mechanism of the controller CON is triggered to change the pulse width modulation signal PWM to low-level (L), and the actual output current IL also begins to decrease due to the current-limit mechanism. The waveform of the current monitoring signal IMON also begins to decrease in response to that the pulse width modulation signal PWM changes to low-level (L). In contrast, the prior art without tri-state simulation does not trigger the OCP at the time t4, so that the current monitoring signal IMON and the output current IL continue to raise.

At the time t5, the output current IL in the prior art without tri-state simulation has exceeded the threshold OCP, which can easily cause the circuit burnout.

During a period from the time t6 to the time t8 and the period from the time t9 to the time t11, the current monitoring signal IMON is approximately equal to the reference voltage REFIN (for example, 1.2V). During the period of tri-state of the pulse width modulation signal PWM, the logic circuit 122 will trigger the switching signal S1=1 to turn on the switching switch SW according to the comparison result CMP, so that the simulation current circuit 10 outputs the reference voltage REFIN as the current monitoring signal IMON.

Please refer to FIG. 5B. In detail, during the period from the time t6 to the time t8, the indication signal TS is at high-level (H) in response to the tri-state period of the pulse width modulation signal PWM. At the time t6, the comparator 120 obtains the comparison result CMP with low-level (L) according to that the current monitoring signal IMON is smaller than the reference voltage REFIN. The logic circuit 122 sends the switching signal S1=0 according to the comparison result CMP to turn off the switching switch SW, so that the monitoring signal generation circuit IMG selects the simulation current signal IMON_EMU to output as the current monitoring signal IMON. At this time, the simulation current circuit 122 responds to that the comparison result CMP is at low-level (L), and the ramp signal generation circuit RG generates a ramp signal with positive slope.

At the time t7, the comparison result CMP of the comparator 120 changes from low-level (L) to high-level (H) by responding to that the current monitoring signal IMON is greater than the reference voltage REFIN, thus the logic circuit 122 is triggered to send the switching signal S1=1 to turn on the switch SW and turn off the switch SW3. The monitoring signal generation circuit IMG selects the reference voltage REFIN to output as the current monitoring signal IMON, and simultaneously causes the simulation current circuit 122 to stop outputting the ramp signal.

At the time t8, the indication signal TS is at low-level (L), and the original generation mechanism of the current monitoring signal IMON is restored.

During a period from the time t9 to the time t11, the indication signal TS is at high level (H) in response to the tri-state period of the pulse width modulation signal PWM.

At the time t9, the comparator 120 generates the comparison result CMP with high-level (H) according to that the current monitoring signal IMON is greater than the reference voltage REFIN, causing the logic circuit 122 to send the switching signal S1=0 to turn off the switching switch SW, causing the monitoring signal generation circuit to select the simulation current signal IMON_EMU to output as the current monitoring signal IMON. At this time, the simulation current circuit 10 responds to that the comparison result CMP is at high-level (H), and the ramp signal generated by the ramp signal generation circuit has negative slope.

At the time t10, the comparison result CMP of the comparator 120 responds to that the current monitoring signal IMON is smaller than the reference voltage REFIN and changes from high-level (H) to low-level (L), thus the logic circuit 122 is triggered to send the switching signal S1=1 to turn on the switch SW and the switch SW3 is turned off. The monitoring signal generation circuit IMG selects the reference voltage REFIN to output as the current monitoring signal IMON, and simultaneously causes the simulation current circuit 122 to stop outputting the ramp signal.

At the time t11, the indication signal TS is at low-level (L), and the original generation mechanism of the current monitoring signal IMON is restored.

Based on the above, it can be seen that when the monitoring signal generation circuit IMG receives the indication signal TS, it will first determine whether the current monitoring signal IMON is equal to the reference voltage REFIN. If the current monitoring signal IMON is not equal to the reference voltage REFIN, the simulation current circuit 10 continues to provide the simulation current signal IMON_EMU to output as the current monitoring signal IMON. If the current monitoring signal IMON is equal to the reference voltage REFIN, the reference voltage REFIN is outputted as the current monitoring signal IMON.

It should be noted that the principle of this method is to use the continuity of the output current (IL) to design. When the pulse width modulation signal PWM enters the tri-state, the upper-bridge switch and the lower-bridge of the output stage OS are both turned off, the actual output current IL will maintain the slope of the original normal operating state and return to zero current. That is to say, if the tri-state is entered when the output current IL is greater than zero, the output current IL will maintain the original slope and linearly decrease; otherwise, the slope of the output current IL will maintain the original slope and linearly increase.

Figure 6:
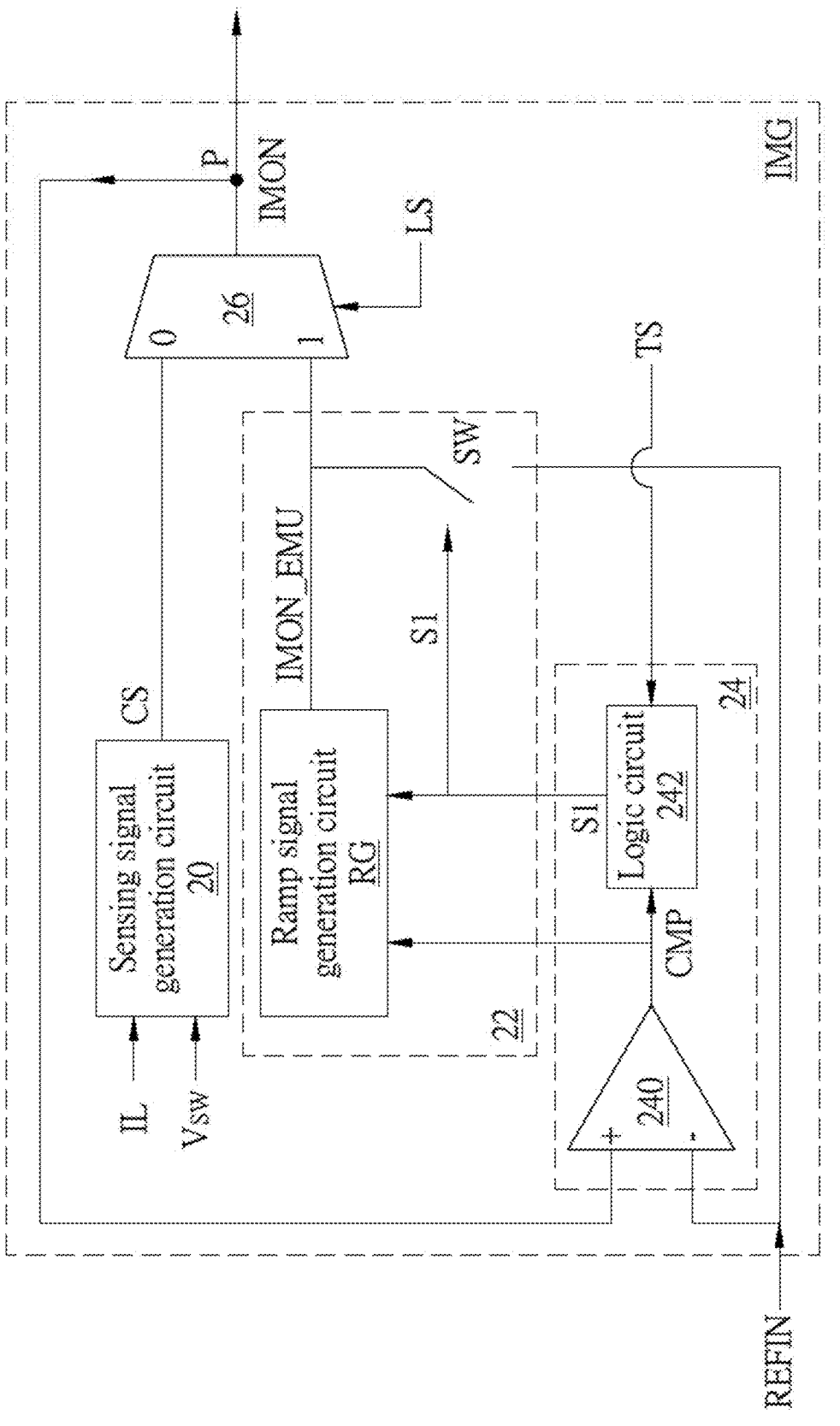
FIG. 6 is a schematic diagram of the monitoring signal generation circuit of the SPS in another embodiment of the invention.

Please refer to FIG. 6, which is a schematic diagram of the monitoring signal generation circuit of the SPS in another embodiment of the invention. The difference from the embodiment of FIG. 2 is that the monitoring signal generation circuit IMG also includes a sensing signal generation circuit 20 and a selector 26. The sensing signal generation circuit 20 senses an output current IL or receives a switching voltage VSW to generate a current sensing signal CS. The selector 26 is respectively coupled to the sensing signal generation circuit 20, an output node of the simulation current circuit 22, and the output terminal P of the monitoring signal generation circuit IMG.

In this embodiment, the selector SE selectively connects the output terminal P of the monitoring signal generation circuit IMG to an output node of the sensing signal generation circuit 20 or the simulation current circuit 22 according to the second control signal LS.

When the pulse width modulation signal PWM is at low-level (L), the second control signal LS is at high-level (H), and the selector SE selects the current sensing signal CS provided by the sensing signal generation circuit 20 to output as the current monitoring signal IMON; when the pulse width modulation signal PWM is at high-level (H) or in the tri-state, the second control signal LS is at low-level (L), and the selector SE selects the simulation current signal IMON_EMU provided by the simulation current circuit 22 to output as the current monitoring signal IMON.

Another embodiment of the invention is a monitoring signal generation method of a SPS. In this embodiment, the monitoring signal generation method of the smart power stage is used to provide a current monitoring signal related to an output current provided by the SPS.

Figure 7:
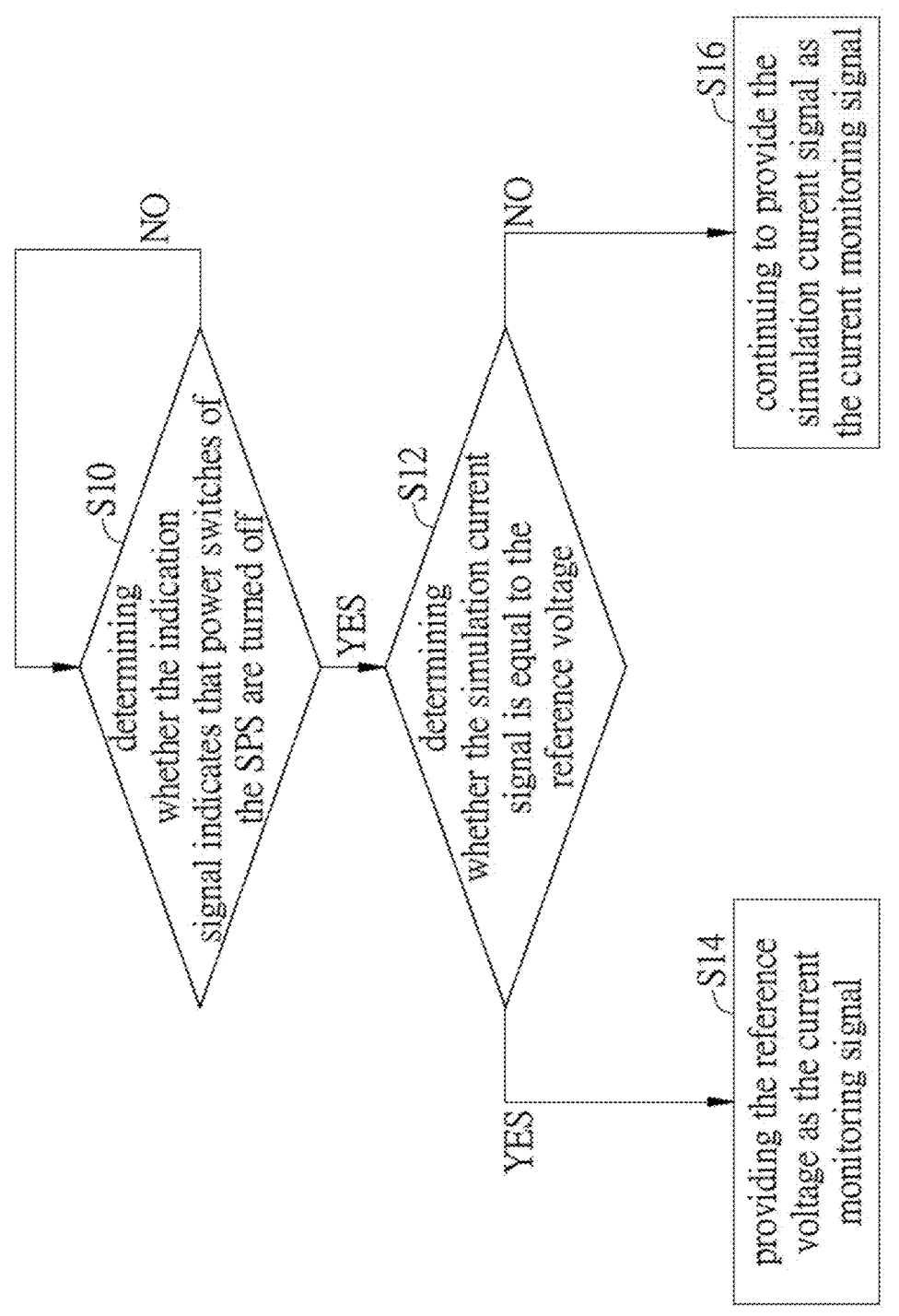
FIG. 7 is a flowchart of a monitoring signal generation method of a SPS in another embodiment of the invention.

Please refer to FIG. 7. FIG. 7 illustrates a flowchart of the monitoring signal generation method of the SPS in this embodiment. As shown in FIG. 7, the monitoring signal generation method of the SPS includes the following steps of:

Step S10: determining whether the indication signal indicates that power switches of the SPS are turned off;

Step S12: if the determination result of the step S10 is yes, determining whether the simulation current signal is equal to the reference voltage;

if the determination result of the step S10 is no, re-execute the step S10;

the step S14: if the determination result of the step S12 is yes, that is to say, the simulation current signal is equal to the reference voltage, then providing the reference voltage as the current monitoring signal; and the step S16: if the determination result of the step S12 is no, that is to say, the simulation current signal is greater than or less than the reference voltage, continuing to provide the simulation current signal as the current monitoring signal.

In practical applications, this method can first compare the current monitoring signal and the reference voltage to generate a comparison result, and then provide the reference voltage as the current monitoring signal according to the indication signal and the comparison result, but not limited to this.

In one embodiment, the SPS receives a PWM signal to provide an output current. The pulse width modulation signal has a first state, a second state and a tri-state between the first state and the second state, and the indication signal is synchronized with the tri-state of the PWM signal. In the tri-state of the PWM signal, when the comparison result indicates that the current monitoring signal is greater than the reference voltage, the ramp signal has a negative slope; when the comparison result indicates that the current monitoring signal is smaller than the reference voltage, the ramp signal has positive slope; when the comparison result indicates that the current monitoring signal is less than the reference voltage, the ramp signal has positive slope. When the comparison result changes state, the DC reference voltage is provided as the simulation signal.

Compared to the prior art, even when the PWM signal received by the SPS is a tri-state signal, the monitoring signal generation circuit and method of the SPS in the invention can still provide a current monitoring signal that reflects the output current waveform (IMON) instead of directly switching the current monitoring signal into the reference voltage, so that the over-current protection (OCP) mechanism can still operate normally.

With the example and explanations above, the features and spirits of the invention will be hopefully well described.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A monitoring signal generation circuit of a smart power stage, the smart power stage providing an output current and the monitoring signal generation circuit providing a current monitoring signal related to the output current, the monitoring signal generation circuit comprising:

a simulation current circuit configured to receive a reference voltage and provide a simulation current signal or the reference voltage as the current monitoring signal; and a control circuit coupled to the simulation current circuit and configured to receive the reference signal, the current monitoring signal and an indication signal, wherein during a period when the indication signal indicates that power switches of the smart power stage are turned off, the control circuit controls the simulation current generation circuit to provide the simulation current signal or the reference voltage as the current monitoring signal according to the current monitoring signal and the reference voltage.

2. The monitoring signal generation circuit of claim 1, wherein the simulation current circuit comprises:

a ramp signal generation circuit coupled to an output node of the simulation current circuit and configured to provide a ramp signal as the simulation current signal during a period when the smart power stage provides the output current; and a switch, one terminal of the switch being coupled to the output node and another terminal of the switch receiving the reference voltage;

wherein during the period when the indication signal indicates that the power switches of the smart power stage are turned off, when the current monitoring signal is not equal to the reference voltage, the switch is turned off to cause the ramp signal generation circuit to continuously provide the ramp signal; when the current monitoring signal is equal to the reference voltage, the switch is turned on, so that the simulation current circuit provides the reference voltage as the current monitoring signal.

3. The monitoring signal generation circuit of claim 2, wherein when the current monitoring signal is greater than the reference voltage, the ramp signal has a negative slope; when the current monitoring signal is less than the reference voltage, the ramp signal has a positive slope.

4. The monitoring signal generation circuit of claim 2, further comprising:

a sensing signal generation circuit configured to generate a current sensing signal according to the output current or a switch voltage of the smart power stage; and a selector coupled to the sensing signal generation circuit, the output node of the simulation current circuit and an output terminal of the monitoring signal generation circuit respectively, configured to selectively connect the output terminal of the monitoring signal generation circuit to the sensing signal generation circuit or the output node of the simulation current circuit according to a pulse width modulation signal.

5. The monitoring signal generation circuit of claim 1, wherein the smart power stage comprises a driver, the monitoring signal generation circuit and an output stage, the driver is coupled to an external controller and the output stage respectively, and is configured to receive a pulse width modulation signal from the controller to control the output stage, the output stage comprises the power switches to provide the output current, the monitoring signal generation circuit is coupled to the drive circuit, the output stage and the controller respectively, and provides the current monitoring signal to the controller according to the pulse width modulation signal, the pulse width modulation signal has a first state, a second state and a tri-state between the first state and the second state, and the indication signal is synchronized with the tri-state of the pulse width modulation signal.

6. The monitoring signal generation circuit of claim 1, wherein the control circuit comprises:

a comparison circuit configured to compare the current monitoring signal with the reference voltage to generate a comparison result; and a logic circuit coupled to the comparison circuit and the simulation current circuit respectively, configured to generate a switching signal according to the indication signal and the comparison result to control the simulation current circuit to provide the reference voltage as the current monitoring signal.

7. The monitoring signal generation circuit of claim 6, wherein during the period when the indication signal indicates that power switches of the smart power stage are turned off, when the comparison result changes state, the switching signal controls the simulation current circuit to output the reference voltage as the current monitoring signal.

8. A monitoring signal generation method of a smart power stage, comprising steps of:

a. generating, by a monitoring signal generation circuit, a current monitoring signal related to an output current provided by the smart power stage;

b. receiving a reference voltage by a simulation current circuit which outputs a simulation current signal or the reference voltage as the current monitoring signal;

c. receiving, by a control circuit, the reference signal, the current monitoring signal and an indication signal;

d. determining, by the control circuit, whether the indication signal indicates that power switches of the smart power stage are turned off; and e. if a determination result of the step d is yes, selectively providing the simulation current signal or the reference voltage as the current monitoring signal according to the current monitoring signal and the reference voltage.

9. The monitoring signal generation method of claim 8, wherein if the current monitoring signal is not equal to the reference voltage, the step (b) continues to provide a ramp signal as the current monitoring signal.

10. The monitoring signal generation method of claim 9, wherein the step (b) comprises:

if the current monitoring signal is greater than the reference voltage, the ramp signal having a negative slope;

if the current monitoring signal is less than the reference voltage, the ramp signal having a positive slope.

11. The monitoring signal generation method of claim 8, wherein the step (b) comprises:

(b1) comparing the current monitoring signal with the reference voltage to generate a comparison result; and (b2) providing the reference voltage as the current monitoring signal according to the indication signal and the comparison result.

12. The monitoring signal generation method of claim 11, wherein when the comparison result changes state, the step (b2) provides the reference voltage as the current monitoring signal.

* * * * *